United States Patent
Liegl

(10) Patent No.: US 7,486,097 B2
(45) Date of Patent: *Feb. 3, 2009

(54) PROXIMITY SENSITIVE DEFECT MONITOR

(75) Inventor: Bernhard R Liegl, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

This patent is subject to a terminal disclaimer.

(21) Appl. No.: 11/606,608

(22) Filed: Nov. 29, 2006

(65) Prior Publication Data
US 2007/0132445 A1 Jun. 14, 2007

Related U.S. Application Data

(62) Division of application No. 11/164,555, filed on Nov. 29, 2005, now Pat. No. 7,176,675.

(51) Int. Cl.
G01R 31/26 (2006.01)
G01R 31/28 (2006.01)

(52) U.S. Cl. ............... 324/765; 324/158.1; 438/18
(58) Field of Classification Search .......... 324/765, 324/158.1; 438/18
See application file for complete search history.

(56) References Cited

U.S. PATENT DOCUMENTS

| | | | |
|---|---|---|---|
| 3,983,479 A | | 9/1976 | Lee et al. |
| 4,144,493 A | | 3/1979 | Lee et al. |
| 4,546,652 A | * | 10/1985 | Virkar et al. .................. 73/776 |
| 4,801,869 A | | 1/1989 | Sprogis |
| 6,268,717 B1 | | 7/2001 | Jarvis et al. |
| 6,362,634 B1 | | 3/2002 | Jarvis et al. |
| 6,762,434 B2 | | 7/2004 | Rumsey et al. |
| 6,783,904 B2 | | 8/2004 | Strozewski et al. |
| 6,859,746 B1 | | 2/2005 | Stirton |
| 6,883,159 B2 | | 4/2005 | Schenker et al. |
| 6,917,194 B2 | * | 7/2005 | Fleischman et al. ...... 324/158.1 |
| 2004/0232910 A1 | | 11/2004 | Ciplickas et al. |

OTHER PUBLICATIONS

Semiconductor Product Yield Analysis Test Site; N.E. Hallas, R.F. Levine and C.H. Scriyner; IBM Technical Disclosure Bulletin, vol. 20, No. 8, Jan. 1978, p. 3099-3100.

* cited by examiner

Primary Examiner—Vincent Q Nguyen
Assistant Examiner—Amy He
(74) Attorney, Agent, or Firm—DeLio & Peterson, LLC; John J. Tomaszewski; Wenjie Li

(57) ABSTRACT

The invention relates to a method for determining processing image induced defects in the manufacture of semiconductor products such as wafers by analyzing the circuit design of the product mask and modifying a conventional test defect structure to mimic the product mask to incorporate one or more isolated or other features including product mask circuit features likely to cause processing image induced defects into the test defect structure.

4 Claims, 6 Drawing Sheets

PROXIMITY SENSITIVE DEFECT MONITOR

This is a Divisional of co-pending U.S. patent application Ser. No. 11/164,555.

BACKGROUND OF THE INVENTION

1. Field of the Invention

This invention relates to semiconductor manufacturing and, in particular, to test structures or defect monitors for diagnosing processing imaged induced defects in a semiconductor product.

2. Description of Related Art

An ongoing concern in semiconductor technology is the maximization of manufacturing yield and one problem in the manufacturing of semiconductors is processing induced image defects which result in physical defects within the semiconductor product and product failure. Exemplary of processing induced image defects which cause circuit failure are open circuits in conductive lines and short circuits between adjacent conductive lines.

In a lithographic imaging process a semiconductor wafer is coated with a layer of resist and the resist layer is then exposed to an illuminating light by passing the light through a mask. The mask controls the amplitude of the light impinging upon the wafer and the mask layer in one process is subsequently developed, non-exposed resist is removed, and the exposed resist produces the image of the mask on the wafer. The image is then plated to form the circuit.

Continued improvements in lithography have been able to print increasingly fine features allowing for smaller device dimensions and higher density devices. However, as features which are smaller than the wave length of the light used to transfer the pattern onto the wafer become increasingly smaller, it has become increasingly more difficult to accurately transfer the pattern onto the wafer.

To solve this problem phase-shifted masks and assist features on the mask have been used. Phase-shifted masks selectively alter the phase of the light transmitted through the mask in order to improve the resolution of the features on the wafer. Assist features, by contrast, are used to pattern isolated high aspect features by nesting these otherwise isolated features in order to take advantage of photoresist and tools which are optimized to pattern nested features.

Another proposed solution termed optical proximity correction (OPC) uses chosen lithographic process parameters (e.g., photoresist) so that the best overall result of dense and isolated features is achieved. To accommodate the processing problems, isolated features are enlarged relative to dense features so that the isolated features print the width that they were designed to be. Therefore, the resulting pattern in the photolithographic process has the isolated features and dense features being the same width as they were designed. This can be achieved by enlarging the isolated features, decreasing the dense features, or a combination of both. Unfortunately, in general, the pattern formed on the photoresist layer is optimized for neither the dense feature nor the isolated feature.

While the above techniques are useful to minimize process induced defects, the subject invention is directed to use of a defect monitor which is formed on the mask and printed on the wafer during the printing of the wafer product to provide an enhanced manufacturing process in which defects can be readily determined and the manufacturing process enhanced.

In the manufacture of semiconductor integrated circuits, it has become conventional to fabricate test structures during the manufacturing process which structures serve to yield reliability data on the regular product circuits. The principal reason for this is that the integrated circuits themselves cannot be probed because the interconnections in the device are neither accessible electrically nor can the regions be isolated from one another to provide accurate data. The typical monolithic integrated semiconductor circuit involves such a dense pattern of impurity regions and metallurgy interconnecting them that the components cannot be readily isolated for testing purposes. Thus, semiconductor designers have found it necessary to design test structures which are isolated from the production circuits and which structures can be tested.

One manufacturing approach is the fabrication of defect monitors on the same wafers on which the actual semiconductor devices are fabricated since the device monitors are therefore fabricated in exactly the same processing environment at exactly the time as the actual semiconductor devices. Thus, the processing defects induced on these defect monitors will be more accurately indicative of the processing defects induced in the actual products. In this approach, the defect monitors are typically fabricated within the kerf or discardable portion of the semiconductor wafer.

In general, the defect test structures comprise a serpentine line, and/or one or more interdigitated lines or combs with the serpentine line. Electrical continuity is checked on the serpentine metal line whereby if a current cannot flow through the serpentine metal line then the serpentine metal line is therefore broken or discontinuous.

Electrical continuity is also checked between the serpentine metal lines and/or at least one of the metal combs. If a current can flow between the serpentine metal line and/or between a metal comb then this implies there is bridging (or shorting) across the gap where there should not be any conductors.

The simplistic design of most electrical defect process monitors, however, samples only a fraction of the design space and process development and product ramp are often conducted electrically blind to two-dimensional imaging effects and imaging linearity. Thus the fast and efficient way of using electric circuit test is generally not available for a qualitative assessment of imaging performance.

A number of patents show conventional defect monitor test structures or modification of the test structures and exemplary patents include U.S. Pat. Nos. 3,983,479; 4,144,493; 4,801,869; 6,362,634; and 6,762,434. While the test structures disclosed therein are useful, there is still a need in the art for more reliable test structures which will enhance the efficiency of the semiconductor manufacturing process.

As used herein, the term "isolated feature" is used to refer to a feature that is approximately a distance away from the next closest feature on all edges, wherein the distance is equal to or greater than approximately four times the minimum width of a feature on a semiconductor wafer. The term "dense feature" is used for referring to a feature that is approximately a distance away from the next closest feature on all edges, wherein the distance is approximately equal to the minimum width of a feature on a semiconductor wafer. The term "space" is used to refer to the distance between the edges of two circuit features and the term "pitch" is used to refer to the distance between the centers of two circuit features. The term "jog" is used to refer to an interruption in the direction of a circuit line, typically in a right angle, to produce a jog (also termed step or notch).

SUMMARY OF THE INVENTION

Bearing in mind the problems and deficiencies of the prior art it is therefore an object of the present invention to provide a method for determining (detecting) processing image induced defects produced during the manufacture of semiconductor products such as wafers.

Another object of the present invention is to provide a defect monitor test structure for detecting processing image induced defects produced during the manufacture of semiconductor products such as wafers.

Still other objects and advantages will in part be obvious and will in part be apparent from the specification.

The above and other objects, which will be apparent to those skilled in art, are achieved in the present invention which is directed to modification of the conventional serpentine and/or comb defect test structures in order to provide sensitivity to gross problems in through-pitch imaging linearity and two-dimensional imaging fidelity. The modification can generally be described as a local distortion of the usually linear pattern, where such distortions incorporated in the conventional test structures can highlight problems with the mask compensation or the process setup, long before full chip functional feedback is available.

The original functionality of testing for circuit opens or shorts can be fully maintained, no additional design 'real estate' is needed and no additional processing costs or test costs occur. The design of the local distortion or modification is flexible and can be adjusted depending on the proximity of the parameter space one wishes to test for and a number of examples are depicted below. Further, the whole area of the original defect monitor can be distorted or just small sections of it, depending on the desired sensitivity.

Conventional serpentine and comb test structures are shown in FIGS. 1A and 4A-6A and test structures modified according to the present invention are shown in FIGS. 1B and 4B-6B.

The modification to the conventional defect monitor can broadly be described as a local distortion of the usually linear pattern, where the systematic introduction of design shapes to the defect test structure is used to sample the design parameter space for imaging failure of shapes in the desired circuit pattern which have a small operational process window where processing image induced defects are likely to occur on the wafer. For example, the processing window of a desired pattern can be analyzed to determine sensitive design pitches and duty ratios by simulation or experiment as shown in FIG. 2. One or more of these sensitive features are then incorporated into the defect test structure design to mimic the product mask circuit pattern. After imaging, the defect test structure is tested to determine shorts or discontinuities in the test circuit. If there are no defects in the test circuit the product image circuit is likewise considered not defective.

In case of the photo process in FIG. 2, distinct pitches with a small process window can be identified, caused by limitation of the mask making process and design process. One should want to sample for failure of features of pitches A, B, C and D on a regular basis using electrical monitors. Features of those pitches should then be inserted as local distortions of the otherwise linear pattern, as shown in FIGS. 1B and 4B-6B.

Using the modified defect test structures of the invention, the electrically simple test defect structure circuit can mimic the actual product layout and highlight problems with the mask compensation or the process setup, long before full chip functional feedback is available. The whole area of the original defect monitor can be distorted or just small sections of it, depending on the desired sensitivity.

The original functionality of testing for circuit opens or short can be fully maintained, no additional design 'real estate' is needed and no additional processing costs or test costs occur.

To implement the method of the invention the design parameter space as shown in FIG. 3 is examined experimentally (or in any other way) to determine the areas of likely process failure and the layout of a given defect testing structure is modified in the areas of the design parameter space with likely process failure.

The details of such a modification can be manifold, as long as a significant sampling of the allowed layout variation is incorporated into the defect testing structure. FIGS. 1B and 4B-6B are examples of such a modification. The distortions to the conventional test structure can vary widely and include changing the line pitch (which may also form isolated or dense spaces), varying the thickness of the lines, changing the direction of the lines (e.g., jogs), adding isolated or dense features, and the like, with the goal being to form the defect test structure to mimic one or more of the features in the product mask likely to cause processing induced failures.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

As noted above, defect test structures are well known and generally comprise a serpentine line, a first comb, and possibly a second comb to test for circuit continuity and short circuits. Such a test structure patent as shown in U.S. Pat. No. 6,762,434 which is incorporated herein by reference.

In general, Applicant's invention is directed to modifying the conventional defect test structure of the prior art to enhance the reliability of the imaging part of the wafer manufacturing process. The modified defect test structure preferably mimics at least in part the product pattern on the mask likely to cause imaged induced circuit defects in case of a degrading manufacturing process. The modified defect test structure is typically located in the product kerf or frame and usually monitored as part of process control. Typically, one or more of the isolated or circuit features of the product mask, changes in line pitch and/or line thickness, and jogs are incorporated into the conventional defect test structure to preferably mimic at least in part the product mask design.

Figure 1A:
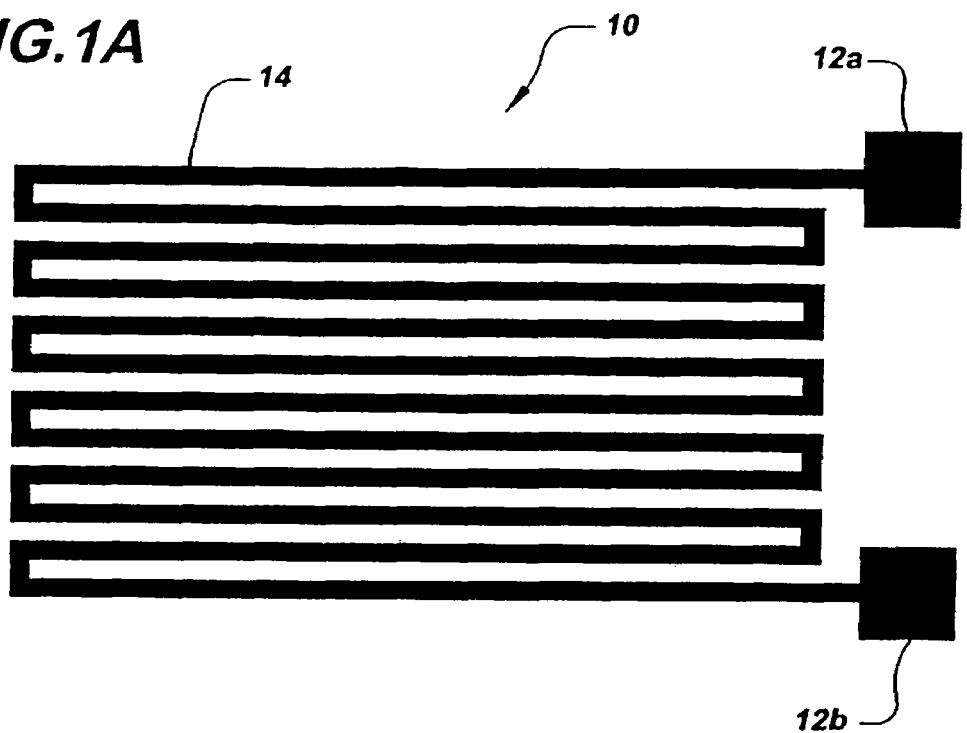
FIG. 1A shows a conventional serpentine defect test structure for testing continuity in a semiconductor circuit.

Referring now to the figures, FIG. 1A shows a conventional serpentine structure for circuit-open testing as numeral 10. The defect structure has test pads 12a and 12b connected by a uniform serpentine line 14. In general, a test voltage would be applied to either or both pads 12a and 12b to determine if there is continuity of circuit in the serpentine line 14.

Figure 1B:
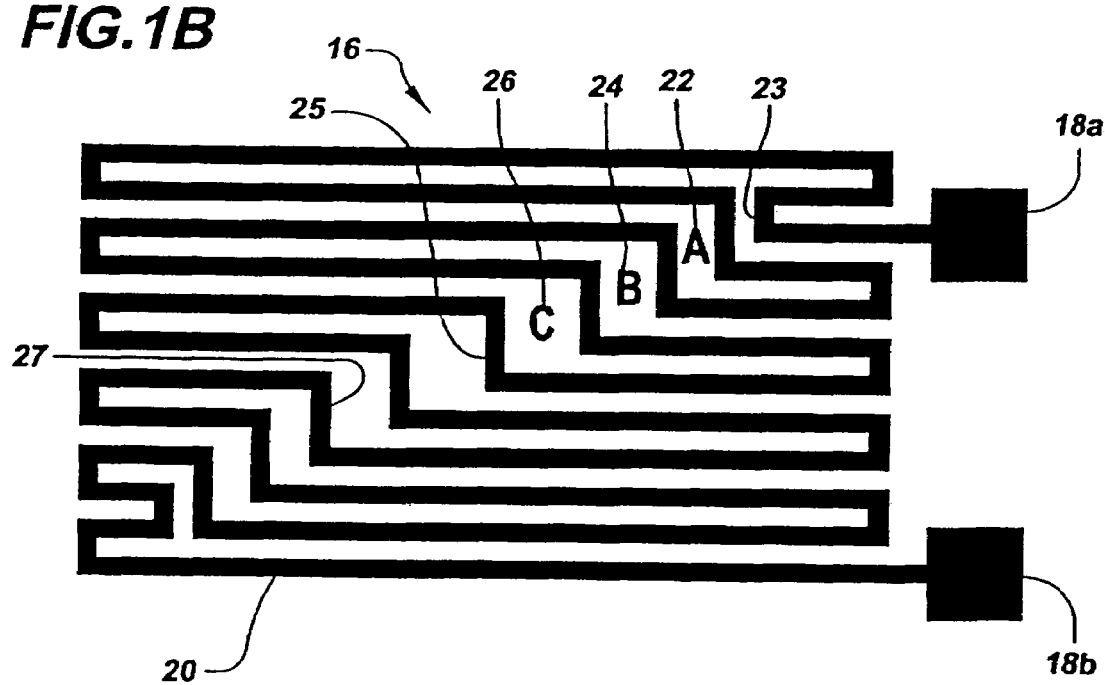
FIG. 1B is a modified serpentine test structure of the invention showing jogs and isolated lines and spaces for detection of OPC failure or errors in the imaging process setup.

In contrast, FIG. 1B shows the conventional serpentine defect test structure as in FIG. 1A has been modified by the method of the invention to form defect test structure 16. Test pads 18a and 18b are similarly used to test the continuity of circuit but distortions such as isolated areas 22(A), 24(B), and 26(C) and jogs 23, 25, and 27 have been inserted into the serpentine line pattern 20 to provide features which are more sensitive to detection of a process-induced failure of the lithographic process and which features mimic similar features of the product mask. Note other distortions are also present in structure 16.

Figure 2:
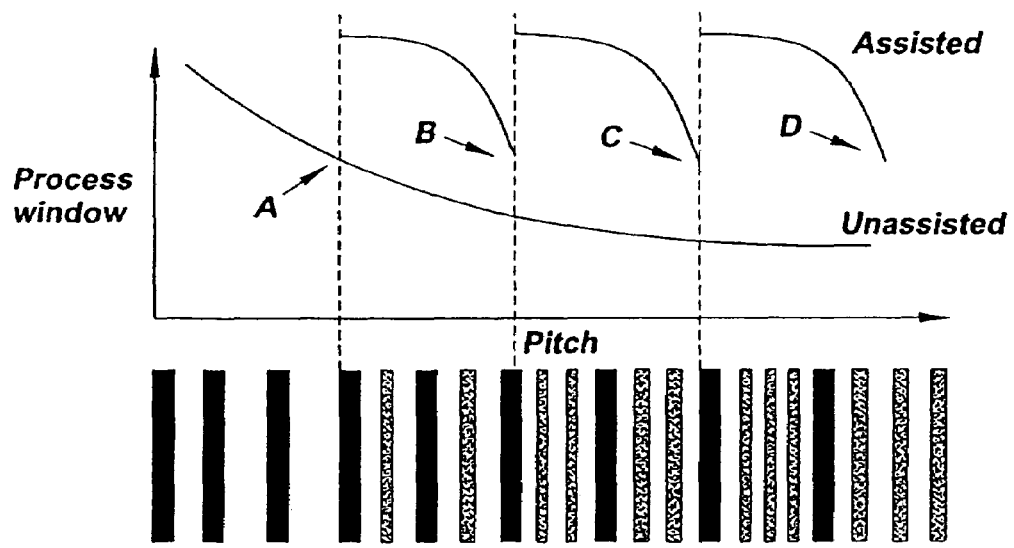
FIG. 2 is a graph showing process window vs. pitch for a mask pattern containing a number of different line pitches.

Referring to FIG. 2, modification of a conventional serpentine structure as shown for example in FIG. 1B may generally be described. A graph showing a process window vs. pitch for a portion of the mask layout shows that the process window decreases as the pitch increases. In this example, isolated features are incorporated in the serpentine structure at points A, B, and C to conform to the low process window as shown in FIG. 2. Thus, the uniform serpentine structure 10 of FIG. 1A is modified as shown in FIG. 1B to incorporate such isolated features which will mimic the mask product pattern to be lithographed onto the wafer surface.

Figure 3A:
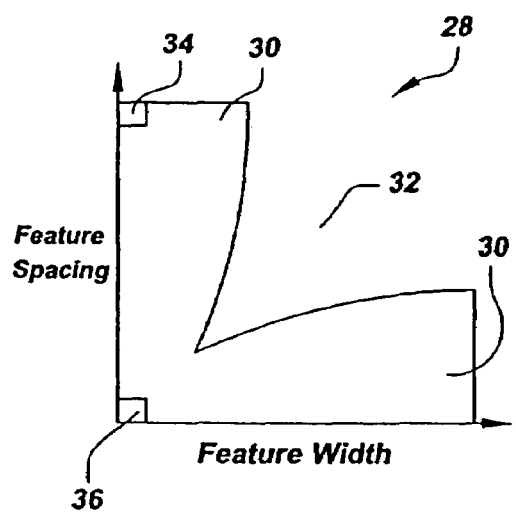
FIG. 3A is a graph showing feature spacing vs. feature width and delimiting areas of small imaging process window where processing image induced failures are likely to occur.

Referring now to FIG. 3A, the effective defect monitoring space of a defect monitor is shown by a plot of functional feature width vs. feature spacing as shown as numeral 28. The area 30 shows a small imaging process window where processing image induced failures are likely to occur. Area 32 is less likely to have a process image induced failure. The traditional defect structure typically provides data for points 34 and 36 within the likely process failure area 30.

Figure 3B:
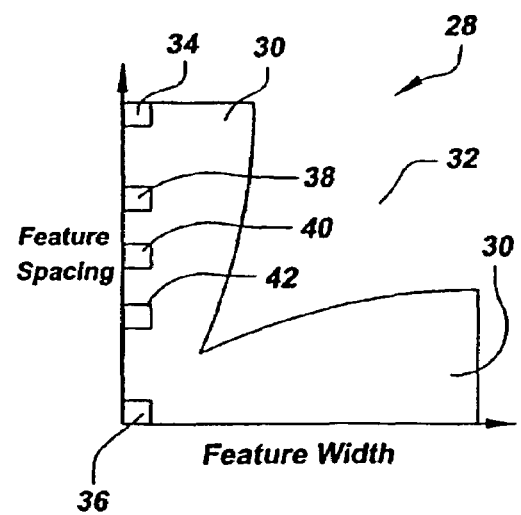
FIG. 3B is a graph of feature spacing vs. feature width and showing where the defect monitor has been modified to more effectively sample the defect monitor design space for processing imaged induced failures.

Referring now to FIG. 3B, a modification of traditional defect monitor by incorporating distortion features such as A, B, and C of FIG. 1B is shown enhancing the effectiveness of the traditional defect monitor by adding additional points of likely process failure as shown by areas 38, 40, and 42 which relate to points A, B, C, respectively.

Using the method of the invention, FIGS. 4A-6B show the effectiveness of using the method of the invention.

Figure 4A:
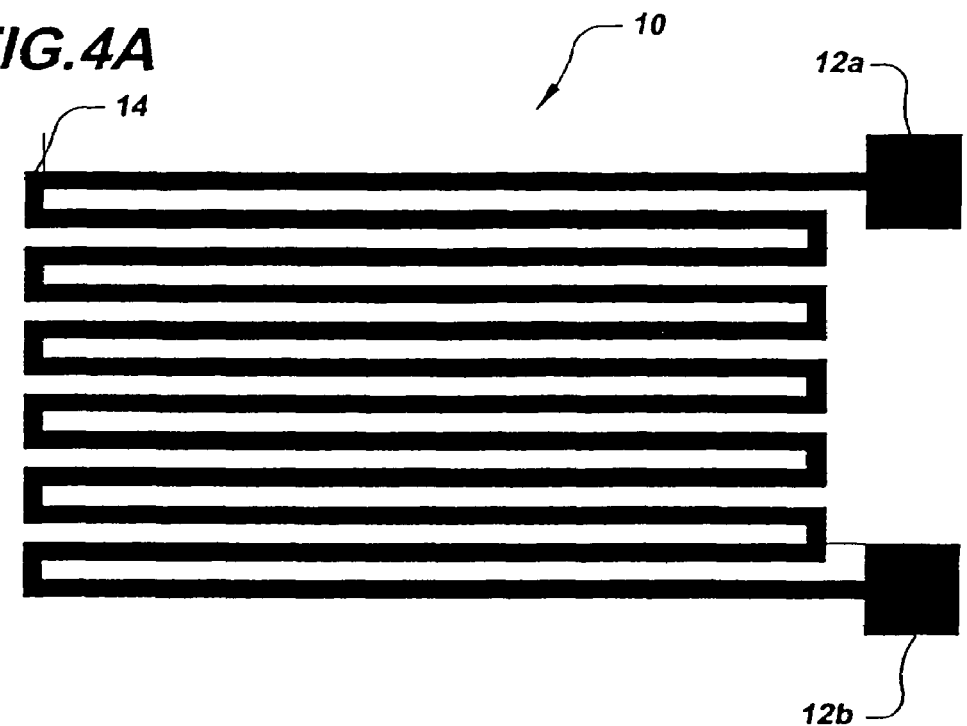
FIG. 4A is a conventional serpentine test structure for testing continuity in a semiconductor circuit and is the same as shown in FIG. 1A.
Figure 4B:
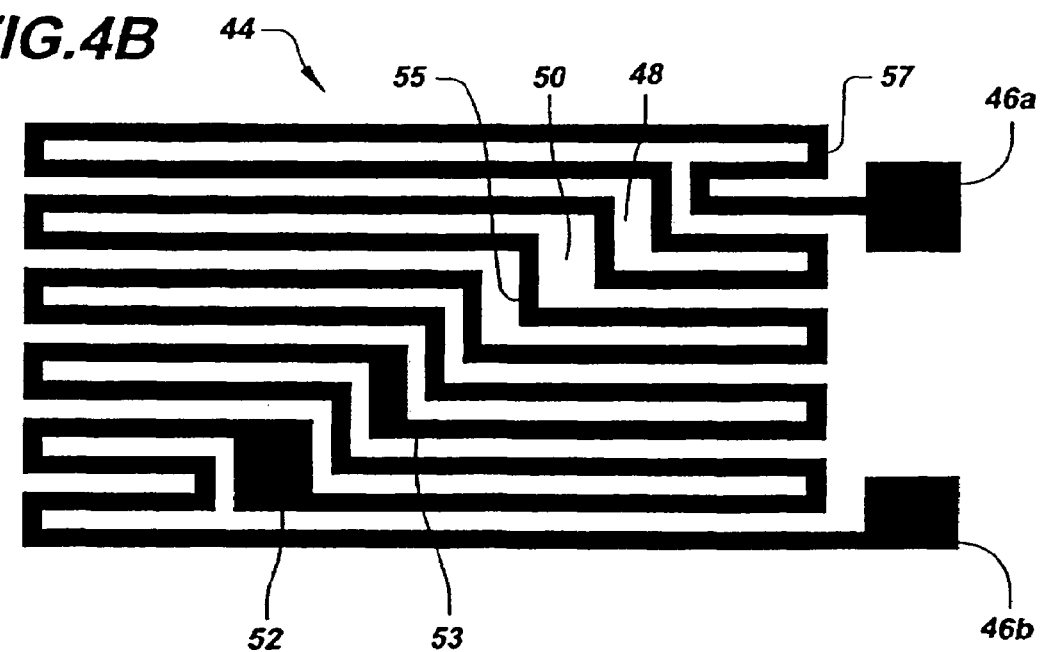
FIG. 4B is a modification of the serpentine test structure of FIG. 4A which defect test structure more effectively tests for processing image induced defects in the wafer.

Thus, FIG. 4A is a conventional serpentine structure for circuit-open testing (which is the same as FIG. 1A). FIG. 4B shows a modified (distorted) defect test structure containing isolated regions 48 and 50 (change in pitch), thicker line features 52 and 53 and jogs 55 and 57 which design is more sensitive to determine processing image induced failures than FIG. 4A. Feature 52 could be, for example, a landing pad for via testing.

Figure 5A:
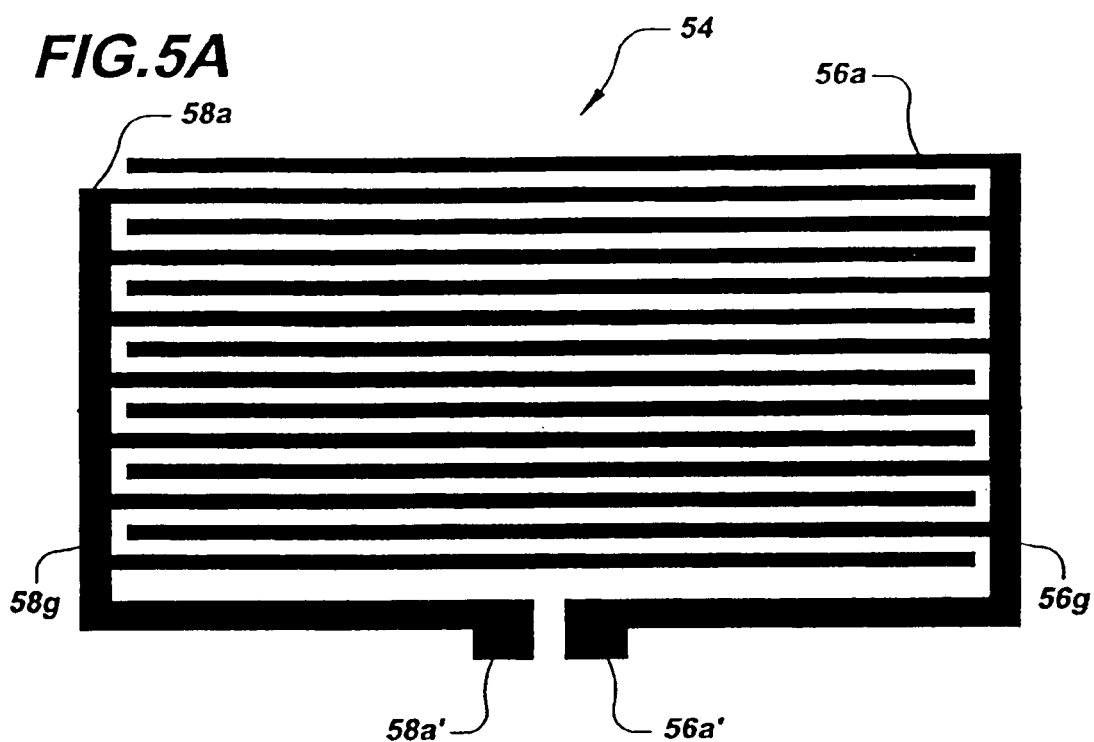
FIG. 5A is a conventional comb structure for circuit-short testing.

Similarly, FIG. 5A shows a conventional comb structure 54 for circuit-short testing which is uniform in design and not sensitive to problems with the imaging lineants. Comb lines 56a-56g interspace with comb lines 58a-58g. Pads are shown as 56a' and 58a'.

Figure 5B:
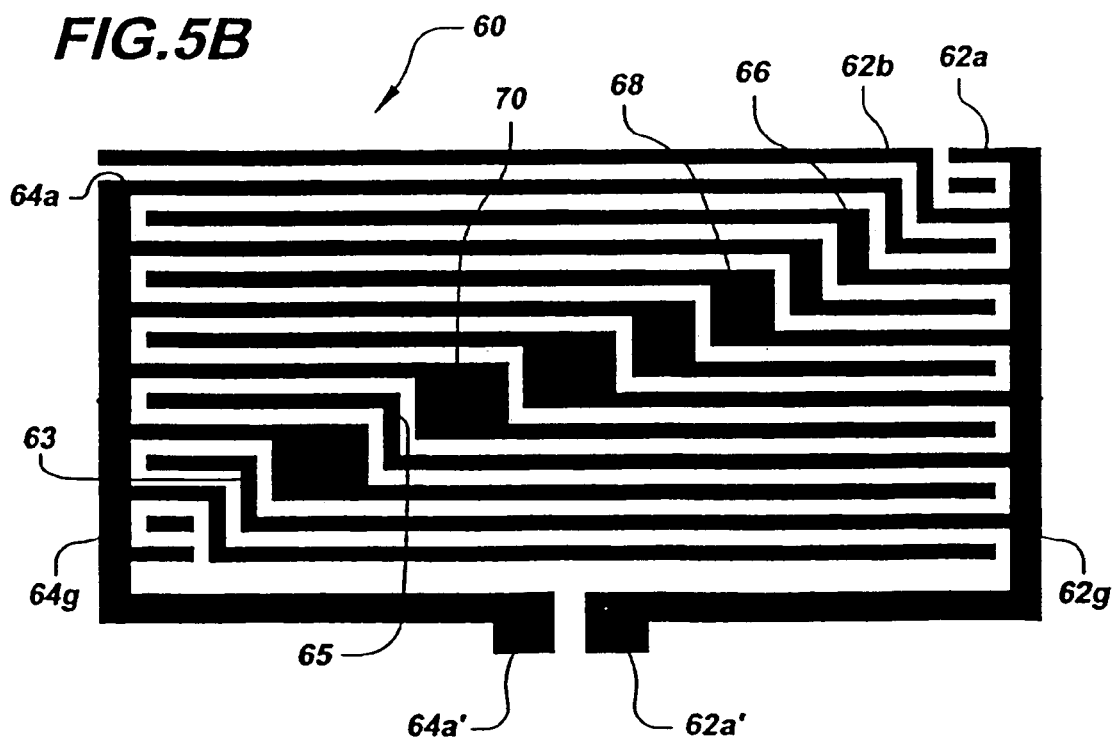
FIG. 5B is the comb structure of FIG. 5A which has been modified according to the invention to more effectively test for processing image induced defects in the wafer.

FIG. 5B shows the conventional comb structure of FIG. 5A modified (distorted) according to the invention to form test defect structure 60. Comb lines 62a-62g and 64a-64g are modified and contain thicker line features 66, 68, and 70 among others. Jogs 63 and 65 are also shown.

Figure 6A:
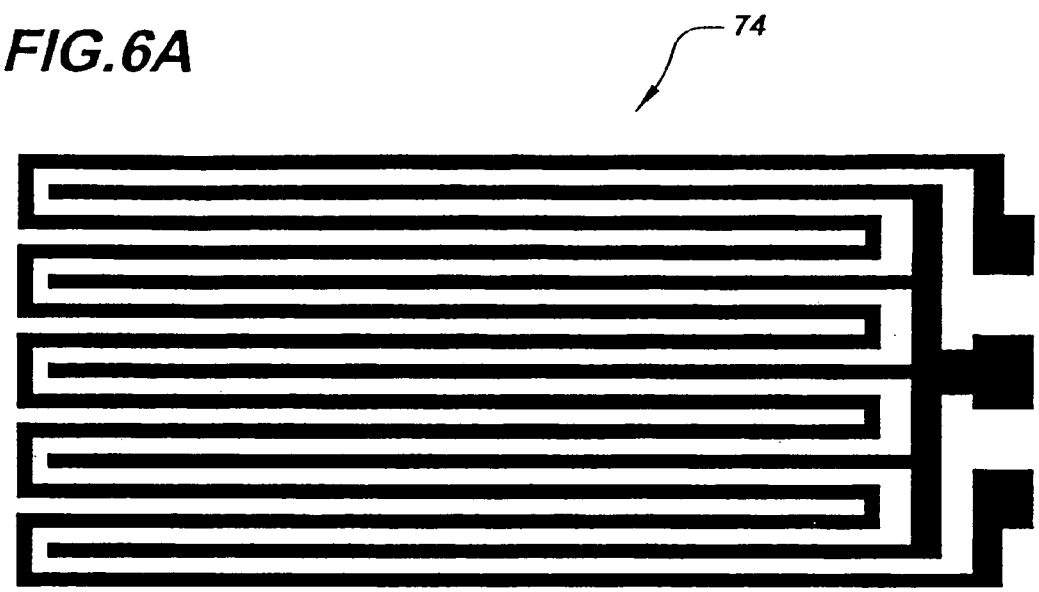
FIG. 6A is a conventional combined serpentine structure for circuit-open testing and a comb structure for circuit-short testing.

Likewise, FIG. 6A shows a combination serpentine and comb defect test structure 74 which are uniform in design.

Figure 6B:
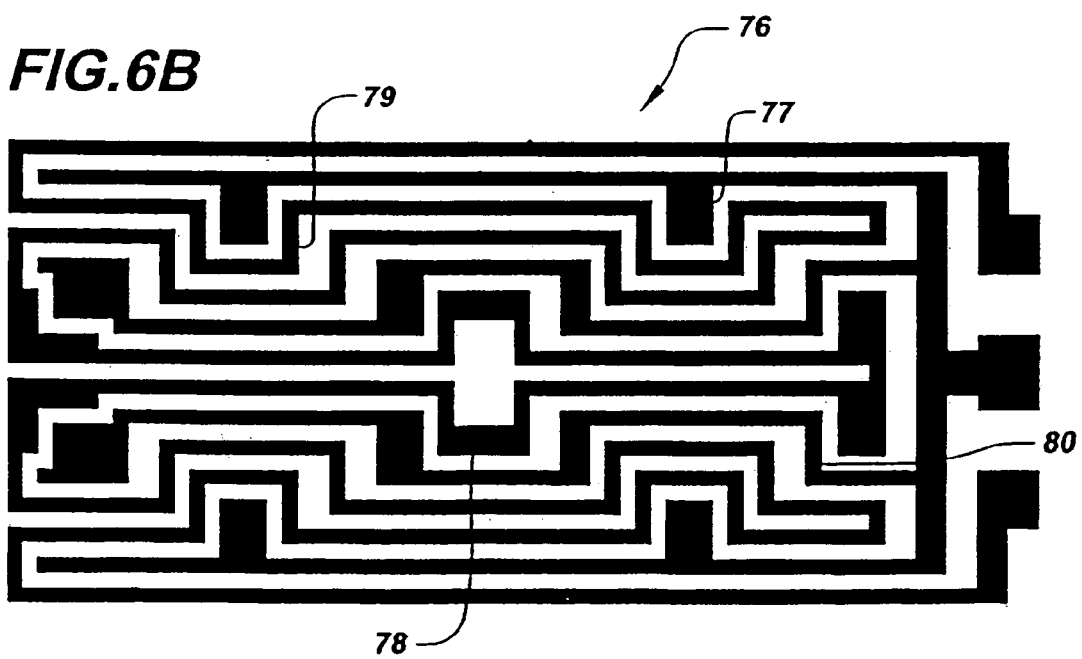
FIG. 6B is the defect test structure of FIG. 6A which has been modified according to the invention to more effectively test for circuit-open testing and circuit-short testing of processing image induced defects in the wafer.

FIG. 6B shows a modified (distorted) serpentine and comb structure of FIG. 6A as numeral 76 which combines a number of distortions such as thicker lines 77 and 78 and jogs 79 and 80 for enhanced detection of processing image induced errors.

Figure 7:
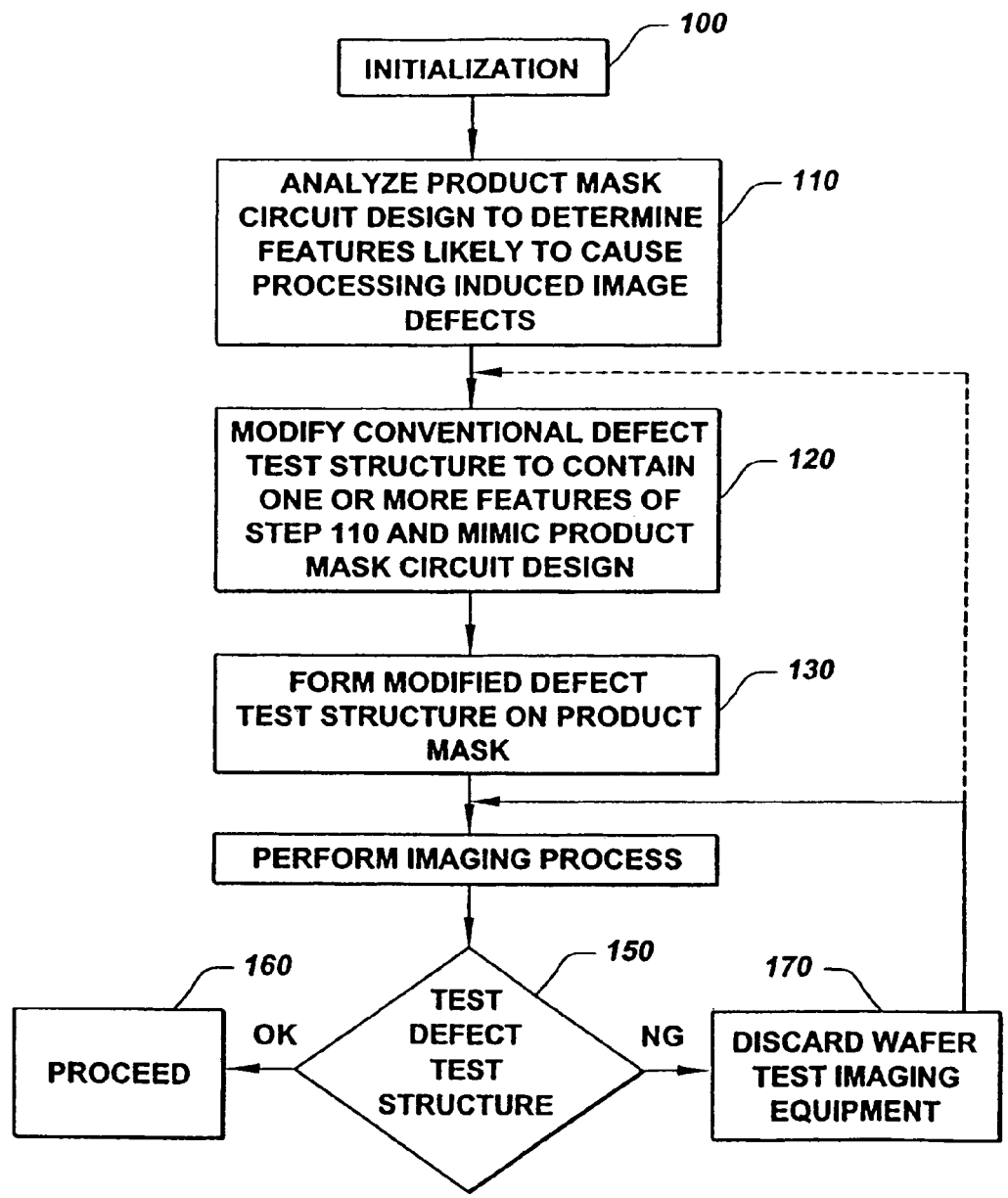
FIG. 7 is a flow chart of the method of the invention.

Referring to FIG. 7 a flow chart of the method of the invention is shown. Step 100 is the initialization of the imaging part of the semiconductor wafer manufacturing process. In step 110 the product mask circuit design is analyzed to determine isolated features and other features of the circuit design which are likely to cause processing image induced failures. In step 120 the conventional defect test structure is modified (distorted) to contain one or more of the product mask isolated or circuit features likely to cause processing image induced defects and the modified (distorted) structure mimics at least in part the product mask design by changing line thickness, pitch, line direction (jogs), etc. The modified defect test structure is incorporated on the product mask in step 130. The imaging process is then performed in step 140 and the defect test structure is tested for circuit and short failures. If there are no failures the manufacturing process proceeds in step 160. If there are processing image induced failures then the wafer is discarded in step 170. If the wafer is discarded the equipment can be tested to determine if the problem can be resolved and the process returned to step 140 to perform the imaging process again. The test defect structure can also be modified and the process returned to step 120.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

What is claimed is:

1. A product mask used to make a semiconductor product comprising:
   a product mask used to make a semiconductor product having a desired circuit design with circuit features thereon;
   a defect monitor test structure containing at least one test circuit line testing processing image induced defects in the product mask, the defect monitor test structure being incorporated on the product mask and having a distortion in the test circuit line of the test structure, wherein the distortion contains one or more features of the product mask likely to cause processing image induced defects to mimic at least in part the features of the product mask.

2. The product mask of claim 1 wherein the distortion changed the pitch of the line.

3. The product mask of claim 1 wherein the distortion changed the thickness of the line.

4. The product mask of claim 1 wherein the distortion added jogs to the line.

* * * * *